United States Patent
Johnson (10) Patent No.: US 9,601,536 B2
(45) Date of Patent: Mar. 21, 2017

(54) SOLID-STATE IMAGE CAPTURING APPARATUS AND CAMERA

(71) Applicant: CANON KABUSHIKI KAISHA, Tokyo (JP)

(72) Inventor: Michiko Johnson, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 17 days.

(21) Appl. No.: 14/610,123

(22) Filed: Jan. 30, 2015

(65) Prior Publication Data

US 2015/0237271 A1 Aug. 20, 2015

(30) Foreign Application Priority Data

Feb. 14, 2014 (JP) .................. 2014-026897

(51) Int. Cl.
*H01L 27/146* (2006.01)

(52) U.S. Cl.
CPC .... *H01L 27/1463* (2013.01); *H01L 27/14603* (2013.01); *H01L 27/14612* (2013.01)

(58) Field of Classification Search
CPC ........... H01L 27/1463; H01L 27/14603; H01L 27/14612; H04N 5/37457
See application file for complete search history.

(56) References Cited

U.S. PATENT DOCUMENTS

| | | | |
|---|---|---|---|
| 8,780,247 B2 | 7/2014 | Yamakawa | |
| 8,786,739 B2 | 7/2014 | Kurihara | |
| 8,860,099 B2 | 10/2014 | Tatani et al. | |
| 2011/0234873 A1* | 9/2011 | Yamakawa | ....... H01L 27/14603 348/300 |
| 2014/0299954 A1 | 10/2014 | Yamakawa | |
| 2014/0300788 A1 | 10/2014 | Sekine | |
| 2015/0001600 A1 | 1/2015 | Tatani et al. | |

FOREIGN PATENT DOCUMENTS

| | | |
|---|---|---|
| JP | 2006-032385 A | 2/2006 |
| JP | 2011-014218 A | 1/2011 |
| JP | 2011-071347 A | 4/2011 |
| JP | 2011-142188 A | 7/2011 |
| JP | 2011-210837 A | 10/2011 |

\* cited by examiner

*Primary Examiner* — Christopher K Peterson
(74) *Attorney, Agent, or Firm* — Fitzpatrick, Cella, Harper & Scinto

(57) ABSTRACT

A solid-state image capturing apparatus, comprising a plurality of photoelectric conversion portions disposed in a first semiconductor region of a first conductivity type, a first portion of the first conductivity type disposed in the first semiconductor region and configured to supply a first potential to the first semiconductor region, and a second semiconductor region of a second conductivity type configured to receive a second potential, wherein the first portion is disposed between first and second photoelectric conversion portions neighboring each other, and the second semiconductor region is disposed between the first portion and each of the first and second photoelectric conversion portions.

24 Claims, 5 Drawing Sheets

SOLID-STATE IMAGE CAPTURING APPARATUS AND CAMERA

BACKGROUND OF THE INVENTION

Field of the Invention

The present invention relates to a solid-state image capturing apparatus and a camera.

Description of the Related Art

A solid-state image capturing apparatus includes, for example, a well formed in a semiconductor substrate and a photoelectric conversion portion formed by implanting, in the well, an impurity of a conductivity type different from that of the well. A contact plug for supplying a potential to the well is electrically connected to the well.

According to Japanese Patent Laid-Open No. 2011-210837, the quality of an image obtained by a solid-state image capturing apparatus may decrease if a minority carrier flowing into a well via a contact plug reaches a photoelectric conversion portion. Furthermore, Japanese Patent Laid-Open No. 2011-210837 has disclosed a structure in which, in order to prevent the above-described minority carrier from reaching the photoelectric conversion portion, a region having an impurity concentration higher than that of the well is formed between the photoelectric conversion portion and a connecting portion of the well to the contact plug. According to this structure, the region functions as a potential barrier against the above-described minority carrier. However, a minority carrier which has obtained energy higher than this potential barrier reaches the photoelectric conversion portion.

SUMMARY OF THE INVENTION

The present invention provides a technique advantageous in preventing a minority carrier from flowing into a photoelectric conversion portion.

A first aspect the present invention provides a solid-state image capturing apparatus, comprising a plurality of photoelectric conversion portions disposed in a first semiconductor region of a first conductivity type, a first portion of the first conductivity type disposed in the first semiconductor region and configured to supply a first potential to the first semiconductor region, and a second semiconductor region of a second conductivity type configured to receive a second potential different from the first potential, wherein the first portion is disposed between, out of the plurality of photoelectric conversion portions, a first photoelectric conversion portion and a second photoelectric conversion portion which are adjacent to each other, and the second semiconductor region is disposed between the first portion and the first photoelectric conversion portion and is disposed between the first portion and the second photoelectric conversion portion.

A second aspect of the present invention provides a solid-state image capturing apparatus, comprising a plurality of photoelectric conversion portions disposed in a first semiconductor region of a first conductivity type, a first portion of the first conductivity type disposed in the first semiconductor region and configured to supply a first potential to the first semiconductor region, and a second semiconductor region of a second conductivity type configured to receive a second potential different from the first potential, wherein the first portion is disposed between two photoelectric conversion portions included in the plurality of photoelectric conversion portions, and the second semiconductor region surrounds the first portion when viewed in a planar view for an upper surface of a substrate including the first semiconductor region.

A third aspect of the present invention provides a solid-state image capturing apparatus, comprising a plurality of photoelectric conversion portions disposed in a first semiconductor region of a first conductivity type to form an array, a first portion of the first conductivity type disposed in the first semiconductor region and configured to supply a first potential to the first semiconductor region, and a second semiconductor region of a second conductivity type configured to receive a second potential different from the first potential, wherein the first portion is disposed between two photoelectric conversion portions included in the plurality of photoelectric conversion portions, the plurality of photoelectric conversion portions include a first photoelectric conversion portion and a second photoelectric conversion portion, a distance from the first photoelectric conversion portion to the first portion and a distance from the second photoelectric conversion portion to the first portion are smaller than a spatial period of the array formed by the plurality of photoelectric conversion portions, and the second semiconductor region is disposed between the first photoelectric conversion portion and the first portion, and is disposed between the second photoelectric conversion portion and the first portion.

Further features of the present invention will become apparent from the following description of exemplary embodiments with reference to the attached drawings.

DESCRIPTION OF THE EMBODIMENTS (1. Overall Arrangement Example of Solid-State Image Capturing Apparatus)

Figure 1:
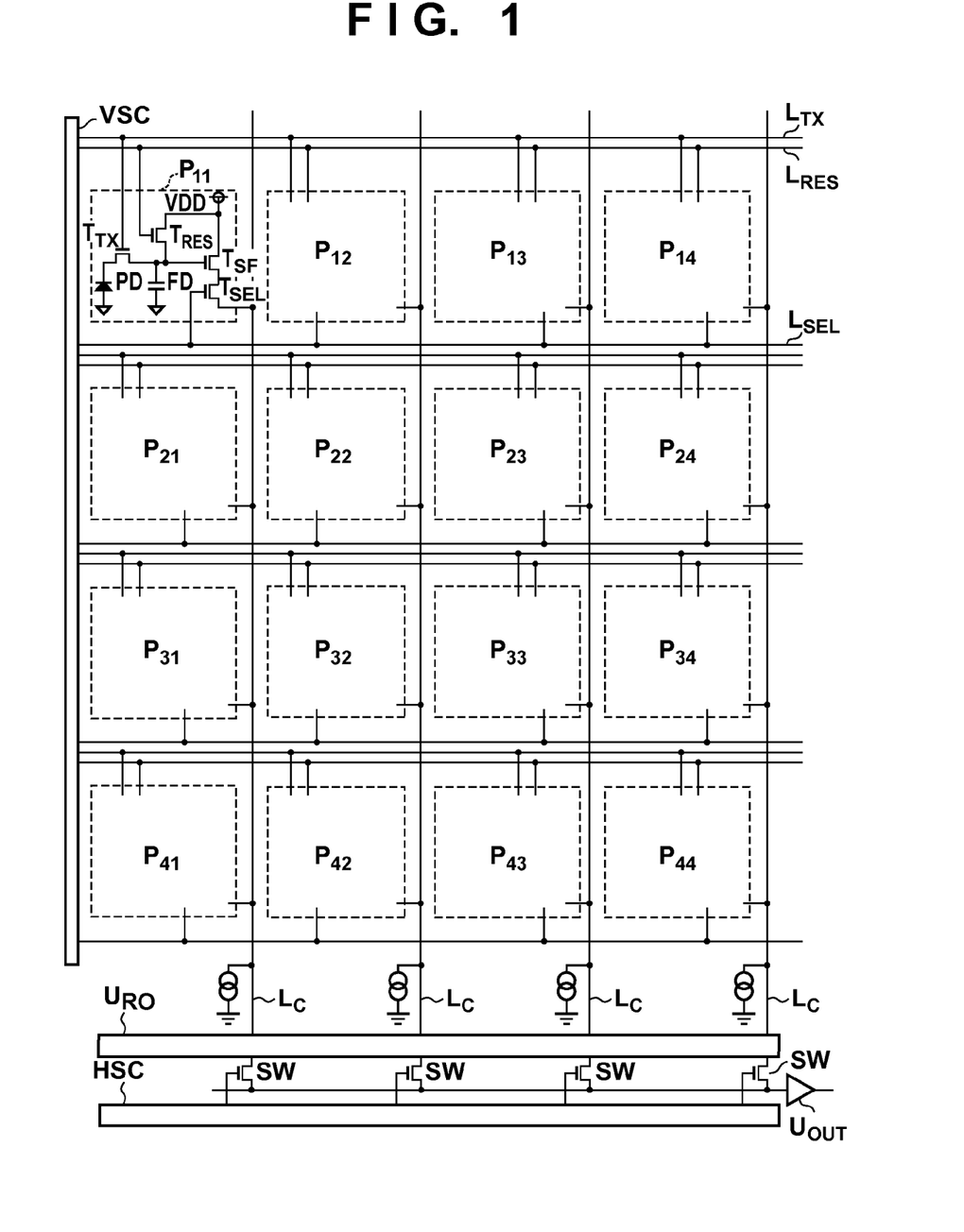
FIG. 1 is a view for explaining an example of the arrangement of a solid-state image capturing apparatus.

FIG. 1 shows an overall arrangement example of a solid-state image capturing apparatus I. The solid-state image capturing apparatus I includes a pixel array where a plurality of pixels P are arrayed, a vertical scanning circuit VSC, a readout unit $U_{RO}$, a horizontal scanning circuit HSC, and an output unit $U_{OUT}$.

An arrangement in which the plurality of pixels P are arrayed in 4 (rows)×4 (columns) is exemplified for the descriptive simplicity. Note that in FIG. 1, the pixel of the Mth row and the Nth column is indicated by "$P_{MN}$". As illustrated in FIG. 1, the pixel $P_{11}$ includes a photoelectric conversion portion PD (for example, a photodiode), a transfer transistor $T_{TX}$, a floating diffusion capacitor FD, a reset transistor $T_{RES}$, an amplification transistor $T_{SF}$, and a selection transistor $T_{SEL}$. The same also applies to the remaining pixels $P_{12}$ to $P_{44}$.

A control signal TX is supplied to the gate terminal of the transfer transistor $T_{TX}$ via a signal line $L_{TX}$. In response to the activation of the control signal TX, the transfer transistor $T_{TX}$ transfers a charge generated by receiving light in the photoelectric conversion portion PD to the floating diffusion capacitor FD. The amplification transistor $T_{SF}$ performs a source follower operation, and the source potential of the amplification transistor $T_{SF}$ changes in accordance with the variation in a charge amount transferred to the floating diffusion capacitor FD. A control signal SEL is supplied to the gate terminal of the selection transistor $T_{SEL}$ via a signal line $L_{SEL}$. In response to the activation of the control signal SEL, the selection transistor $T_{SEL}$ outputs a pixel signal in accordance with the source potential of the amplification transistor $T_{SF}$ to a corresponding column signal line $L_C$. Furthermore, a control signal RES is supplied to the gate terminal of the reset transistor $T_{RES}$ via a signal line $L_{RES}$. In response to the activation of the control signal RES, the reset transistor $T_{RES}$ resets the pixel P. In this arrangement, the reset transistor $T_{RES}$ connects the floating diffusion capacitor FD to a power supply node and resets the potential of the floating diffusion capacitor FD. As another example of the resetting of the pixel P, the reset transistor $T_{RES}$ may reset the potential of the photoelectric conversion portion PD.

The vertical scanning circuit VSC outputs, for each row, the above-described control signal TX for reading out a pixel signal from each pixel P or the like to each pixel P. The readout unit $U_{RO}$ reads out the pixel signal from each pixel P for each column. Note that the readout unit $U_{RO}$ may perform a predetermined process on the readout pixel signal. The horizontal scanning circuit HSC drives a switch SW for each column to horizontally transfer the pixel signal read out for each column by the readout unit $U_{RO}$ sequentially. The output unit $U_{OUT}$ outputs the horizontally transferred pixel signal outside.

(2. Reference Example of Pixel Structure)

Figure 2A:
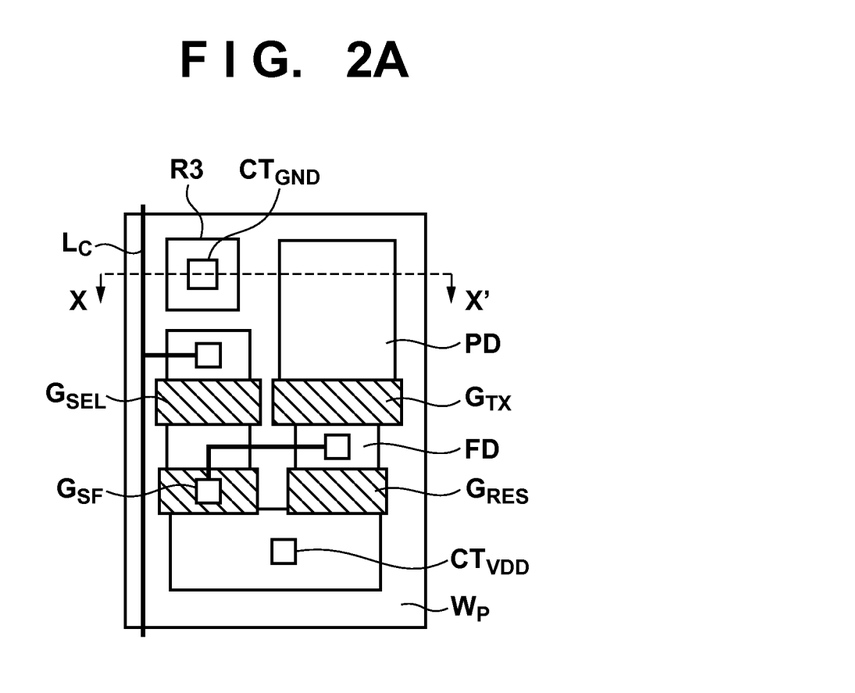
FIGS. 2A and 2B are views for explaining a reference example of the layout and the sectional structure of pixels.
Figure 2B:
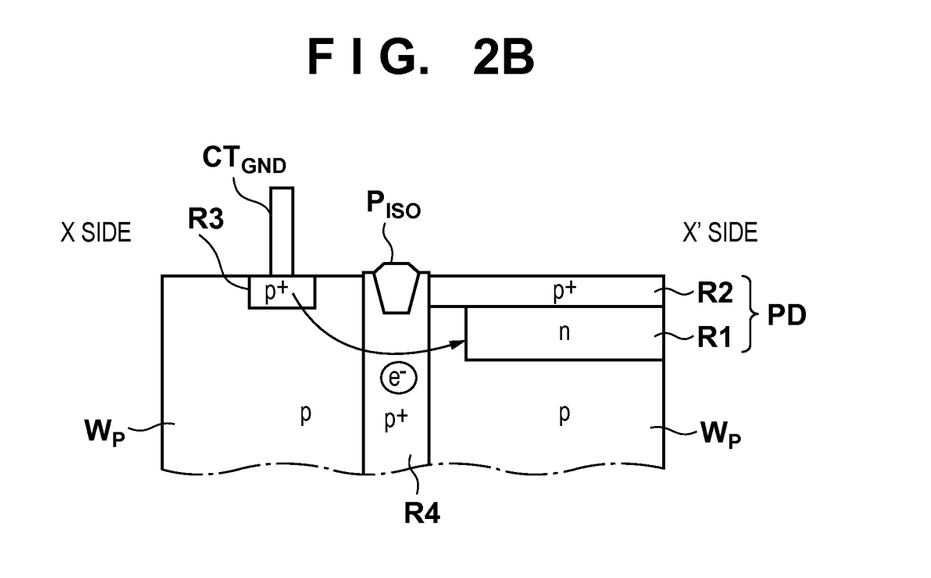

FIGS. 2A and 2B are schematic views showing a reference example of the structure of a unit pixel P'. FIG. 2A shows the layout arrangement of the pixel P'. FIG. 2B shows a sectional structure taken along a cut line X-X'. Note that in FIG. 2A, the gate electrodes of the aforementioned transistors $T_{TX}$, $T_{RES}$, $T_{SF}$, and $T_{SEL}$ are indicated by "$G_{TX}$", "$G_{RES}$", "$G_{SF}$", and "$G_{SEL}$", respectively.

Respective elements (to be simply referred to as the "respective elements" hereinafter) such as a photoelectric conversion portion PD and a transistor $T_{TX}$ are disposed, or formed, in a p-type (first conductivity type) well $W_P$ on the substrate. Note that the structure in which the respective elements are disposed in the p-type well $W_P$ is exemplified here. The respective elements, however, may be disposed on a p-type semiconductor substrate or on a semiconductor region such as a p-type epitaxial growth layer.

The respective elements are electrically isolated from each other by an element isolation portion $P_{ISO}$ disposed on the surface of the well $W_P$. The element isolation portion $P_{ISO}$ is formed by, for example, a STI (Shallow Trench Isolation) method or a LOCOS (LOCal Oxidation of Silicon) method.

The photoelectric conversion portion PD is formed by implanting an n-type (second conductivity type) impurity in the well $W_P$ to form an n-type region R1. The n-type region R1 forms a pn junction with the well $W_P$. The photoelectric conversion portion PD may be formed as a so-called buried type by further implanting a p-type impurity on the region R1 (the surface of the well $W_P$) to form a p-type region R2. Note that a method of forming the photoelectric conversion portion PD by implanting the n-type impurity in the well $W_P$ has been exemplified here. The photoelectric conversion portion PD, however, may be formed by forming the n-type region R1 adjacent to the well $W_P$ to contact the well $W_P$.

The source and drain of, for example, the transistor $T_{TX}$ are formed by implanting the n-type impurity using the gate electrode $G_{TX}$ or the like as a self-aligning mask.

A contact $CT_{VDD}$ supplies a potential to the drain of each of a transistors $T_{RES}$ and $T_{SF}$. A fixed potential or a power supply potential (a power supply voltage VDD, in this embodiment) is supplied to the drain of each of the transistors $T_{RES}$ and $T_{SF}$. Note that the potential may vary in transient response to a change in a current or the like even if it is the fixed potential. In this specification, supplying the fixed potential means that the potential converges to a predetermined potential even if a transient potential variation occurs.

A contact $CT_{GND}$ is electrically connected to the well $W_P$ and grounds the well $W_P$ (fixes the well $W_P$ to a ground potential or a reference potential). A region R3 is a p-type region having a p-type impurity concentration higher than that of the well $W_P$ and forms the ohmic contact (first portion) between the well $W_P$ and the contact $CT_{GND}$.

Note that each of the contacts $CT_{VDD}$ and $CT_{GND}$ may be referred to as a "contact plug" or an "electrode".

As illustrated in FIG. 2B, a p-type region R4 having a p-type impurity concentration higher than that of the well $W_P$ is formed between the photoelectric conversion portion PD and the contact $CT_{GND}$ when the upper surface of the substrate is viewed from the upper side. The region R4 can function, in the well $W_P$, as a potential barrier against a minority carrier (electrons) flowing from the contact $CT_{GND}$. As shown by an arrow in FIG. 2B, however, the minority carrier may reach the photoelectric conversion portion PD by its diffusion. This may bring about a decrease in image quality as a dark current component when obtaining a pixel signal.

(3. Example of Pixel Structure According to Present Invention)

(3-1. First Embodiment)

Figure 3A:
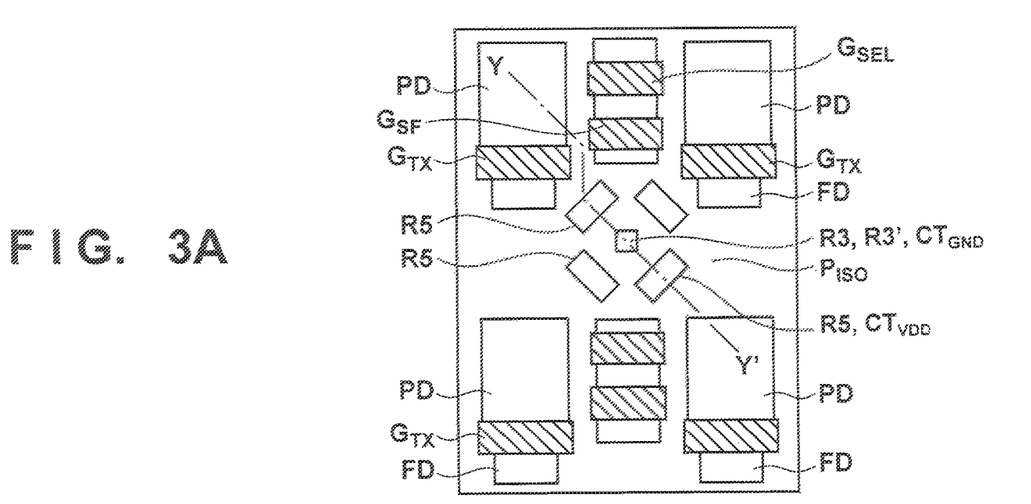
FIGS. 3A and 3B are views for explaining an example of the layout and the sectional structure of pixels.
Figure 3B:
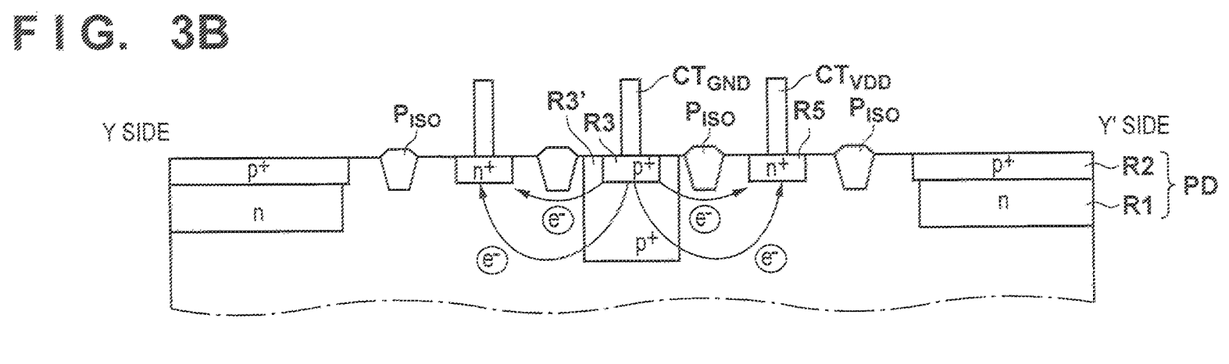

FIGS. 3A and 3B are schematic views illustrating a part of a region in a pixel array structure. FIG. 3A mainly shows the layout arrangement between respective photoelectric conversion portions PD of four pixels P, and transistors $T_{SF}$ and $T_{SEL}$ arranged among them. FIG. 3B shows a sectional structure taken along a cut line Y-Y'. Note that for the descriptive simplicity, a wiring pattern indicating the connection relationship among respective elements is not shown.

When the upper surface of the substrate is viewed from the upper side, a vertical direction or a horizontal direction is referred to as an "opposite side direction", and an oblique direction is referred to as a "diagonal direction". The pixel array formed by the plurality of photoelectric conversion portions PD has a cycle in a direction such as the opposite side direction or the diagonal direction. If, for example, 20 photoelectric conversion portions PD out of the plurality of them are arrayed over a distance of about 100 µm in the opposite side direction, the cycle of the plurality of photoelectric conversion portions PD in the opposite side direction is about 5 µm. Alternatively, if 20 photoelectric conversion portions PD are arrayed over a distance of about 141.4 µm in the diagonal direction, the cycle of the 20 photoelectric conversion portions PD in the diagonal direction is about 7.1 µm.

In this embodiment, as shown in FIG. 3A, a contact $CT_{GND}$ for grounding the potential of a well $W_P$ is formed between the photoelectric conversion portions PD which neighbor each other (which are adjacent to each other) in the diagonal direction. Note that as shown in FIG. 3B, a p-type region R3' having a p-type impurity concentration equal to or lower than that of a p-type region R3 which forms the ohmic contact between the well $W_P$ and the contact $CT_{GND}$ may be formed under the region R3 to cover the region R3. The distance from the region R3 to each of the photoelectric conversion portions PD is shorter than the cycle in which the plurality of photoelectric conversion portions are arrayed.

Note that the case in which the regions R3 and R3', and the contact $CT_{GND}$ are arranged between the neighboring pixels (pixels which are adjacent to each other) in the diagonal direction has been exemplified here. However, the same also applies to a case in which they are arranged between the neighboring pixels in the opposite side direction. That is, in the opposite side direction and the diagonal direction, two pixels without another pixel between them are referred to as "neighboring pixels", and the relationship between these two pixels is expressed as "neighbor each other". The cycle in the predetermined direction of the plurality of photoelectric conversion portions is almost equal to the distance between the centers of the photoelectric conversion portions PD of two neighboring pixels which neighbor each other in that direction.

N-type regions R5 are formed between the regions R3 and R3', and the photoelectric conversion portions PD. A contact $CT_{VDD}$ supplies the power supply voltage VDD to each region R5.

Note that element isolation portions $P_{ISO}$ formed from an insulating material may be formed between the regions R3 and R3' and the regions R5, and between the regions R5 and the photoelectric conversion portions PD, respectively.

According to the above-described arrangement, as shown in arrows in FIG. 3B, a minority carrier flowing from the contact $CT_{GND}$ is guided to each region R5 by electric field diffusion and does not reach each photoelectric conversion portion PD. Therefore, a dark current component when obtaining a pixel signal is suppressed, and the quality of an image obtained by a solid-state image capturing apparatus I increases. The minority carrier is guided to each region R5 effectively by keeping a potential in each region R5 higher than that in a region R1. This applies to not only the minority carrier from the contact $CT_{GND}$, but also a minority carrier caused by an interface trap at the interface between a semiconductor region and an insulating film above or the lattice defect of the semiconductor region.

Each n-type region R5 may be formed to have an impurity concentration lower than that of each of the source and drain of an NMOS transistor which forms each unit (a vertical scanning circuit VSC, a readout unit $U_{RO}$, a horizontal scanning circuit HSC, an output unit $U_{OUT}$, or the like) outside the pixel array. This can increase a breakdown voltage for an overvoltage such as power supply noise.

The contact $CT_{VDD}$ electrically connected to each region R5 is preferably arranged, in the planar view, between each of four photoelectric conversion portions PD and the regions R3 and R3'. Particularly, the contact $CT_{VDD}$ is preferably arranged between each of four photoelectric conversion portions PD and the contact $CT_{GND}$, and is more preferably arranged on a line that connects them to each other.

The regions R3 and R3', and the contact $CT_{GND}$ are preferably arranged in positions having the shortest and a substantially equal distance from the four photoelectric conversion portions PD. This uniformly suppresses a dark current component with respect to each photoelectric conversion portion PD, and effectively suppresses characteristic variations among pixels.

Note that the regions R3, R3', and R5, and the contacts $CT_{GND}$ and $CT_{VDD}$ may be arranged among the respective pixels or between the neighboring pixels in the pixel array with a predetermined interval (for example, for every predetermined number rows or columns).

As described above, this embodiment is advantageous in increasing image quality because it prevents the minority carrier from flowing into the photoelectric conversion portions, resulting in suppressing the dark current component when obtaining the pixel signal.

Note that the structure in which the power supply voltage VDD is supplied to the drain of each of a transistor $T_{RES}$ and the transistor $T_{SF}$, and thus supplied to the contact $CT_{VDD}$ to supply a fixed potential to each region R5 has been exemplified in this embodiment. However, another fixed potential may be supplied to each region R5 in a range where the solid-state image capturing apparatus I operates appropriately.

(3-2. Second Embodiment)

Figure 4A:
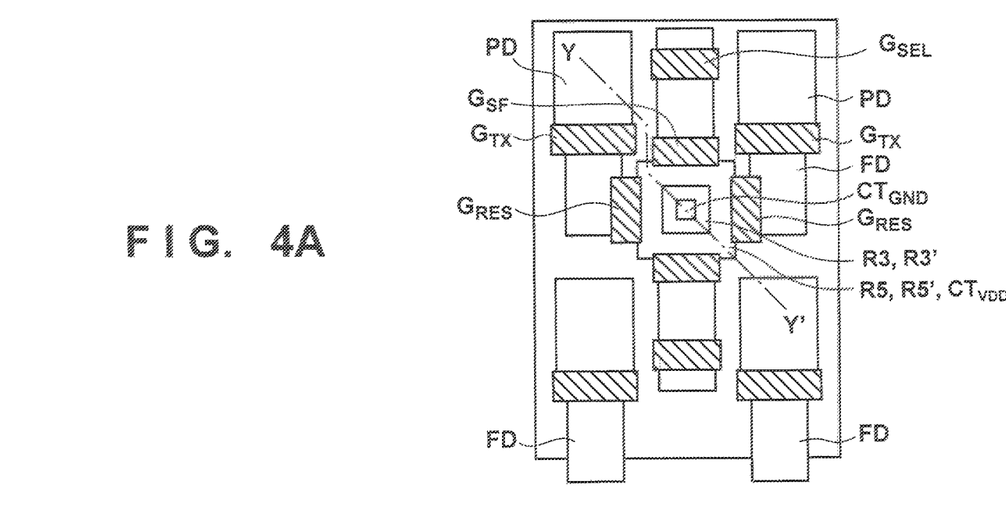
FIGS. 4A and 4B are views for explaining an example of the layout and the sectional structure of pixels.
Figure 4B:
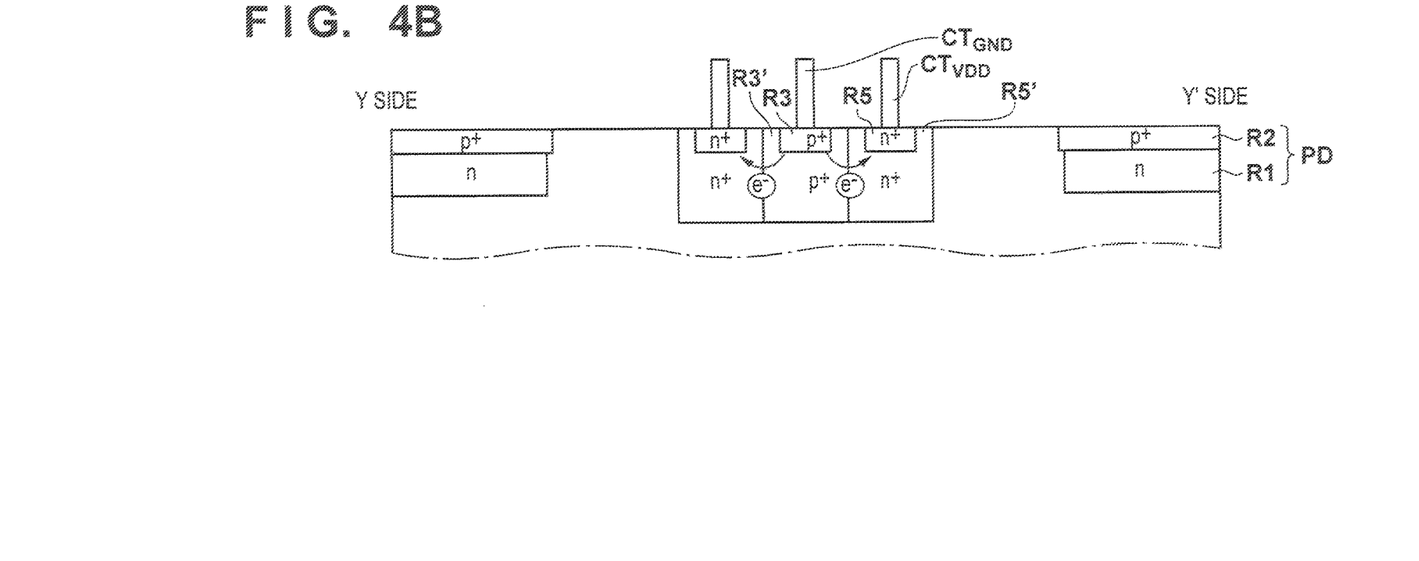

FIGS. 4A and 4B illustrate a part of a region in a pixel array structure as in the aforementioned first embodiment (FIGS. 3A and 3B). FIG. 4A shows a layout arrangement and FIG. 4B shows a sectional structure taken along a cut line Y-Y'.

This embodiment is different from the aforementioned first embodiment mainly in that an n-type region R5 is formed to surround p-type regions R3 and R3' when the upper surface of the substrate is viewed from the upper side. According to this structure, a minority carrier from a contact $CT_{GND}$ is guided to the region R5 more effectively.

An n-type region R5' having an n-type impurity concentration equal to or lower than that of the region R5 may be formed under the region R5 to cover the region R5. Note that the structure in which the regions R3' and R5' are formed to contact each other has been exemplified here. However, they may be separated from each other.

The region R5' is preferably formed from the surface of a well $W_P$ to a position deeper than each photoelectric conversion portion PD. According to this structure, the minority carrier from the contact $CT_{GND}$ is guided to the regions R5 and R5' effectively. For the same reason, the region R5' may be formed from the surface of the well $W_P$ to a position deeper than the region R3', and further, extend to a part of a region under the region R3' so as not to electrically isolate the well $W_P$ from the regions R3 and R3'.

A power supply voltage VDD is supplied to the regions R5 and R5' which surround the regions R3 and R3'. The regions R5 and R5' may be electrically connected to, for example, the drain of each transistors $T_{RES}$ and $T_{SF}$ or formed integrally with the drain. According to this structure, the layout efficiency of pixels P improves.

On the other hand, the drain of each transistors $T_{RES}$ and $T_{SF}$ can also function as the regions R5 and R5'. Therefore, the regions R5 and R5' may not be formed between the regions R3 and R3', and a certain pixel (to be referred to as the "pixel $P_A$") when the transistors $T_{RES}$ and $T_{SF}$ of the pixel $P_A$ are arranged between the regions R3 and R3', and the photoelectric conversion portion PD of the pixel $P_A$.

Depending on, for example, the specifications of a solid-state image capturing apparatus I, noise caused by the minority carrier from the contact $CT_{GND}$ may not be considered. Depending on the specifications, therefore, neither the transistors $T_{RES}$ and $T_{SF}$ nor the region R5 may be formed between the regions R3 and R3', and the photoelectric conversion portions PD of some pixels. Examples include a pixel which is relatively unsusceptible to the influence of noise (a pixel of a color having the relatively small influence of noise in a color-compatible pixel array such as a Bayer arrangement) and a pixel having a distance to the region R3 relatively larger than those of the other pixels. Furthermore, for example, in a pixel for focus detection having an opening smaller than those of the other pixels, the distance from each photoelectric conversion portion to each contact can become relatively large.

Therefore, this embodiment is advantageous in improving the layout efficiency, in addition to obtaining the same effect as in the aforementioned first embodiment.

Figure 5A:
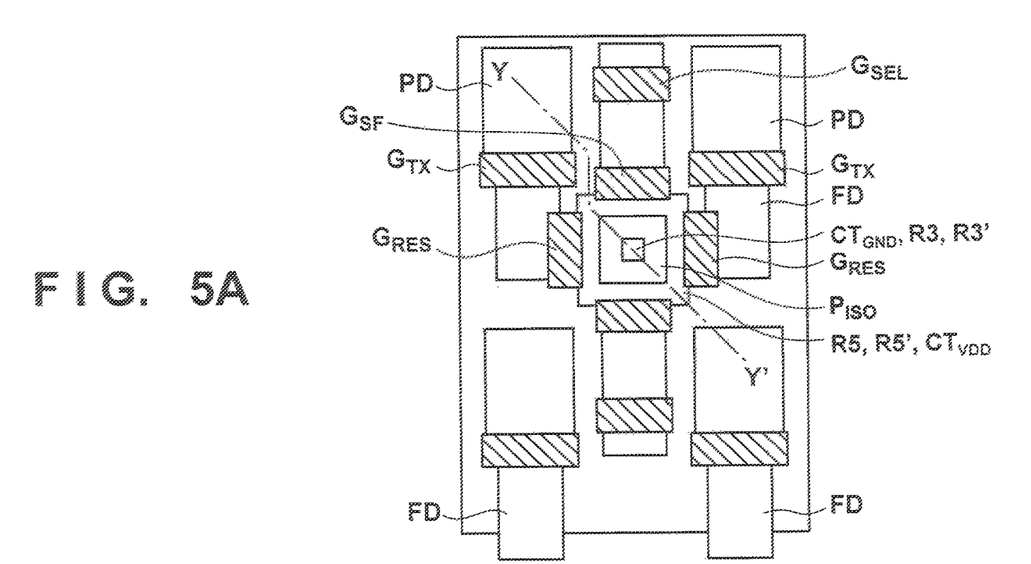
FIGS. 5A and 5B are views for explaining an example of the layout and the sectional structure of the pixels.
Figure 5B:
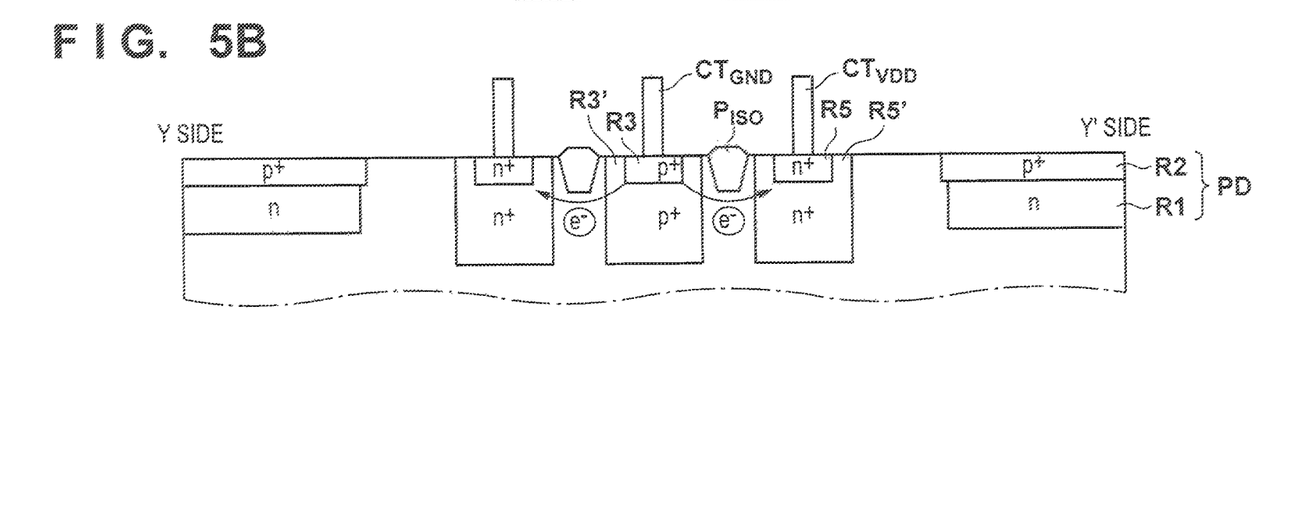

FIGS. 5A and 5B show, as in FIGS. 4A and 4B, a modification of a part of a region in a pixel array structure according to this embodiment. FIG. 5A shows a layout arrangement and FIG. 5B shows a sectional structure taken along the cut line Y-Y'. In the aforementioned FIGS. 4A and 4B, the structure in which the regions R3' and R5' are formed to contact each other has been shown. As illustrated in FIGS. 5A and 5B, however, an element isolation portion $P_{ISO}$ may be formed between the regions R3' and R5'.

(4. Others)

Two preferred embodiments have been exemplified above. However, the present invention is not limited to these embodiments. Some parts may be changed in accordance with an application or the like without departing from the scope of the present invention. For example, each embodiment above has been described by setting the first conductivity type to a p type and the second conductivity type to an n type. However, the same also applies to a case in which the polarities of the conductivity types of respective semiconductor regions are reversed.

In each embodiment described above, the present invention has been described by exemplifying a solid-state image capturing apparatus included in an image capturing system represented by a camera or the like. The concept of the image capturing system includes not only apparatuses primarily aiming at shooting but also apparatuses (for example, personal computer and portable terminal) secondarily having a shooting function. The image capturing system can include the solid-state image capturing apparatus exemplified in each embodiment described above, and a processor that processes a signal output from the solid-state image capturing apparatus. The processor can include, for example, an A/D converter, and a processor that processes digital data from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-026897, filed Feb. 14, 2014, which is hereby incorporated by reference herein in its entirety.

What is claimed is:

1. A solid-state image capturing apparatus comprising:
   a first semiconductor region of a first conductivity type provided in a substrate;
   a first photoelectric conversion portion and a second photoelectric portion, each disposed in the first semiconductor region, the first photoelectric conversion portion and the second photoelectric conversion portion being adjacent to each other;
   a first portion of the first conductivity type disposed in the first semiconductor region and configured to supply a first potential to the first semiconductor region; and
   two second semiconductor regions, in a cross sectional view including the first photoelectric conversion portion and the second photoelectric conversion portion, of a second conductivity type, each of the two second semiconductor regions configured to receive a second potential different from the first potential,
   wherein, in a planar view for an upper face of the substrate,
      the first portion is disposed between the first photoelectric conversion portion and the second photoelectric conversion portion, and
      one of the two second semiconductor regions is disposed between the first portion and the first photoelectric conversion portion and the other of the two second semiconductor regions is disposed between the first portion and the second photoelectric conversion portion.

2. The solid-state image capturing apparatus according to claim 1, further comprising
   a first electrode electrically connected to the first portion; and
   a second electrode electrically connected to the one of the second semiconductor regions and configured to supply the second potential to the one of the second semiconductor regions,
   wherein the second electrode is disposed, in the planar view, between the first electrode and the first photoelectric conversion portion.

3. The solid-state image capturing apparatus according to claim 1, further comprising a pixel including at least one of the first photoelectric conversion portion and the second photoelectric conversion portion,
   wherein the pixel includes at least one MOS transistor, and the one of the second semiconductor regions is a drain of the at least one MOS transistor.

4. The solid-state image capturing apparatus according to claim 3, wherein the at least one MOS transistor includes at least one of:
   an amplification transistor configured to amplify a signal based on a charge generated in the first photoelectric conversion portion; and
   a reset transistor configured to reset the pixel.

5. The solid-state image capturing apparatus according to claim 1, further comprising a unit configured to read out signals from the first photoelectric conversion portion and the second photoelectric conversion portion, wherein
   a source and a drain of at least one MOS transistor included in the unit have the second conductivity type, and
   the one of the second semiconductor regions has an impurity concentration lower than those of the source and the drain.

6. The solid-state image capturing apparatus according to claim 1, wherein, in the planar view, the two second semiconductor regions surround the first portion.

7. The solid-state image capturing apparatus according to claim 6, wherein the first semiconductor region extends below the first photoelectric conversion portion and the second photoelectric conversion portion through a region under the second semiconductor regions.

8. The solid-state image capturing apparatus according to claim 1, further comprising an element isolation portion including an insulating material disposed between the first portion and the one of the second semiconductor regions.

9. The solid-state image capturing apparatus according to claim 8, wherein the first semiconductor region extends below the first photoelectric conversion portion through a region under the element isolation portion.

10. The solid-state image capturing apparatus according to claim 1, wherein the one of the second semiconductor regions extends to a position deeper than the first photoelectric conversion portion.

11. The solid-state image capturing apparatus according to claim 1, wherein each of the first photoelectric conversion portion and the second photoelectric conversion portion includes a third semiconductor region of the second conductivity type configured to form a pn junction with the first semiconductor region.

12. The solid-state image capturing apparatus according to claim 1, wherein the second potential is a power supply potential.

13. The solid-state image capturing apparatus according to claim 1, wherein the first potential is a ground potential.

14. The solid-state image capturing apparatus according to claim 1, wherein the two second semiconductor regions are integrally provided to form a single semiconductor region.

15. A camera comprising:
a solid-state image capturing apparatus comprising:
    a first semiconductor region of a first conductivity type provided in a substrate;
    a first photoelectric conversion portion and a second photoelectric conversion portion, each disposed in the first semiconductor region, the first photoelectric conversion portion and the second photoelectric conversion portion being adjacent to each other;
    a first portion of the first conductivity type disposed in the first semiconductor region and configured to supply a first potential to the first semiconductor region; and
    two second semiconductor regions, in a cross sectional view including the first photoelectric conversion portion and the second photoelectric conversion portion, of a second conductivity type, each of the two second semiconductor regions configured to receive a second potential different from the first potential,
    wherein, in a planar view for an upper face of the substrate,
        the first portion is disposed between the first photoelectric conversion portion and the second photoelectric conversion portion, and
        one of the two second semiconductor regions is disposed between the first portion and the first photoelectric conversion portion and the other the two second semiconductor regions is disposed between the first portion and the second photoelectric conversion portion; and
a processor configured to process a signal output from the solid-state image capturing apparatus.

16. A solid-state image capturing apparatus comprising:
a first semiconductor region of a first conductivity type provided in a substrate;
a first photoelectric conversion portion and a second photoelectric conversion portion, each disposed in the first semiconductor region, the first photoelectric conversion portion and the second photoelectric conversion portion being adjacent to each other;
a first portion of the first conductivity type disposed in the first semiconductor region and configured to supply a first potential to the first semiconductor region; and
a second semiconductor region of a second conductivity type configured to receive a second potential different from the first potential,
wherein, in a planar view for an upper face of the substrate,
    the first portion is disposed between the first photoelectric conversion portion and the second photoelectric conversion portion, and
    the second semiconductor region is disposed between the first portion and the first photoelectric conversion portion and between the first portion and the second photoelectric conversion portion, and surrounds the first portion.

17. A camera comprising:
a solid-state image capturing apparatus comprising:
    a first semiconductor region of a first conductivity type provided in a substrate;
    a first photoelectric conversion portion and a second photoelectric conversion portion, each disposed in the first semiconductor region, the first photoelectric conversion portion and the second photoelectric conversion portion being adjacent to each other;
    a first portion of the first conductivity type disposed in the first semiconductor region and configured to supply a first potential to the first semiconductor region; and
    a second semiconductor region of a second conductivity type configured to receive a second potential different from the first potential,
    wherein, in a planar view for an upper face of the substrate,
        the first portion is disposed between the first photoelectric conversion portion and the second photoelectric conversion portion, and
        the second semiconductor region is disposed between the first portion and the first photoelectric conversion portion and between the first portion and the second photoelectric conversion portion, and surrounds the first portion; and
a processor configured to process a signal output from the solid-state image capturing apparatus.

18. A solid-state image capturing apparatus comprising:
a first semiconductor region of a first conductivity type provided in a substrate;
a first photoelectric conversion portion and a second photoelectric conversion portion, each disposed in the first semiconductor region, the first photoelectric conversion portion and the second photoelectric conversion portion being adjacent to each other;
a first portion of the first conductivity type disposed in the first semiconductor region and configured to supply a first potential to the first semiconductor region; and
a second semiconductor region of a second conductivity type configured to receive a second potential different from the first potential,
wherein, in a planar view for an upper face of the substrate,
    the first photoelectric conversion portion and the second photoelectric conversion portion are part of a plurality of photoelectric conversion portions which are provided in the first semiconductor region so as to form an array,
    the first portion is located away from each of the first photoelectric conversion portion and the second photoelectric conversion portion at a distance smaller than a cycle of the array, and
    the smallest distance between the first portion and the second semiconductor region is smaller than the smallest distance between the first portion and the first photoelectric conversion portion, and is smaller than the smallest distance between the first portion and the second photoelectric conversion portion.

19. The solid-state image capturing apparatus according to claim 18, further comprising a pixel including at least one of the first photoelectric conversion portion and the second photoelectric conversion portion,
wherein, in the planar view,
the first photoelectric conversion portion and the second photoelectric conversion portion are adjacent to each other in one of a row direction and a column direction of the array,
the pixel includes a MOS transistor provided between the first photoelectric conversion portion and the second photoelectric conversion portion and configured to read out a signal from the at least one of the first photoelectric conversion portion and the second photoelectric conversion portion, and
the first portion is located at a position shifted from the MOS transistor in the other of the row direction and the column direction.

20. The solid-state image capturing apparatus according to claim 19, wherein, in the planar view,
the pixel further includes a floating diffusion located at a position shifted from the at least one of the first photoelectric conversion portion and the second photoelectric conversion portion in the other of the row direction and the column direction, and
the first portion and the floating diffusion are adjacent to each other in the one of the row direction and the column direction.

21. The solid-state image capturing apparatus according to claim 18, wherein, in the planer view, the second semiconductor region is provided each of between the first portion and the first photoelectric conversion portion and between the first portion and the second photoelectric conversion portion.

22. The solid-state image capturing apparatus according to claim 18, wherein, in the planer view, the second semiconductor region provided between the first portion and the first photoelectric conversion portion and the second semiconductor region provided between the first portion and the second photoelectric conversion portion are integrally formed.

23. The solid-state image capturing apparatus according to claim 18, wherein the first semiconductor region includes a second portion of the first conductivity type between the first portion and the second semiconductor region in the planer view, the second portion having an impurity concentration lower than that of the first portion.

24. A camera comprising:
a solid-state image capturing apparatus comprising:
a first semiconductor region of a first conductivity type provided in a substrate;
a first photoelectric conversion portion and a second photoelectric conversion portion, each disposed in the first semiconductor region, the first photoelectric conversion portion and the second photoelectric conversion portion being adjacent to each other;
a first portion of the first conductivity type disposed in the first semiconductor region and configured to supply a first potential to the first semiconductor region; and
a second semiconductor region of a second conductivity type configured to receive a second potential different from the first potential, and
wherein, in a planar view for an upper face of the substrate,
the first photoelectric conversion portion and the second photoelectric conversion portion are part of a plurality of photoelectric conversion portions which are provided in the first semiconductor region so as to form an array,
the first portion is located away from each of the first photoelectric conversion portion and the second photoelectric conversion portion at a distance smaller than a cycle of the array, and
the smallest distance between the first portion and the second semiconductor region is smaller than the smallest distance between the first portion and the first photoelectric conversion portion, and is smaller than the smallest distance between the first portion and the second photoelectric conversion portion; and
a processor configured to process a signal output from the solid-state image capturing apparatus.

* * * * *